United States Patent [19]

Potts et al.

[11] Patent Number: 5,238,777
[45] Date of Patent: Aug. 24, 1993

[54] BAKEABLE AQUEOUS PHOTOPOLYMERS AND THEIR USE IN PRINTING PLATES

[75] Inventors: Rodney M. Potts; Terence Etherington, both of Leeds; Jianrong Ren, Morley; Victor Kolodziejczyk, Bradford, all of United Kingdom

[73] Assignee: DuPont (U.K.) Limited, Stevenage Hertfortshire, United Kingdom

[21] Appl. No.: 563,446

[22] Filed: Aug. 7, 1990

[30] Foreign Application Priority Data

Aug. 9, 1989 [GB] United Kingdom ............... 8918161

[51] Int. Cl.$^5$ .................... G03F 7/012; G03F 7/32; C08F 16/26
[52] U.S. Cl. ................... 430/195; 430/167; 430/197; 430/325; 525/327.3; 525/330.4; 525/330.5; 525/333.5; 525/344; 525/504; 525/505
[58] Field of Search ............... 430/167, 195, 197, 167, 430/325; 525/327.3, 328.7, 328.8, 330.4, 330.5, 333.3, 333.4, 333.5, 344, 374, 386, 504, 505, 508

[56] References Cited

U.S. PATENT DOCUMENTS

| | | | |
|---|---|---|---|
| 2,948,610 | 7/1955 | Merritt et al. | 430/195 |
| 3,821,167 | 6/1974 | Asano | 430/195 |
| 3,843,603 | 10/1974 | Gates | 430/287 |
| 3,923,761 | 12/1975 | Parker et al. | 430/195 |
| 4,229,514 | 10/1980 | Kunita et al. | 430/195 |
| 4,994,530 | 2/1991 | Etherington et al. | 430/175 |

FOREIGN PATENT DOCUMENTS

| | | | |
|---|---|---|---|
| 0030862 | 11/1978 | European Pat. Off. | |
| 1220808 | 3/1979 | United Kingdom | |
| 2018779A | 10/1979 | United Kingdom | 430/195 |
| 2068136A | 7/1980 | United Kingdom | |
| 1513368 | 4/1981 | United Kingdom | |

Primary Examiner—Charles L. Bowers, Jr.
Assistant Examiner—John S. Chu
Attorney, Agent, or Firm—Francis C. Hand

[57] ABSTRACT

A radiation-sensitive compound, which comprises a polymer including a plurality of azide-substituted aromatic ester groups and a plurality of carboxylic or sulphonic acid groups capable of imparting to the compound solubility in aqueous or alkaline medium. After image-wise exposure, the compound can be developed using an aqueous or alkaline developer. The compound is useful in the production of radiation sensitive plates for the manufacture of lithographic printing plates which can be baked to improve printing life.

6 Claims, No Drawings

BAKEABLE AQUEOUS PHOTOPOLYMERS AND THEIR USE IN PRINTING PLATES

FIELD OF THE INVENTION

This invention relates to radiation-sensitive compounds and more particularly, but not exclusively, is concerned with radiation-sensitive compounds which are bakeable aqueous photopolymers for use in the manufacture of radiation-sensitive plates for lithographic printing plate production.

BACKGROUND OF THE INVENTION

Radiation-sensitive plates comprising a substrate coated with a radiation-sensitive composition are well known in the production of lithographic and other types of printing plate, and similar compositions are used for other purposes such as photoresists.

In use, the composition is image-wise exposed to radiation so that parts of the composition are struck by radiation and parts are not. The radiation and non-radiation struck parts have differing solubilities in developer liquids, and thus the more soluble parts can be selectively removed by application of such a liquid.

As is well known, radiation-sensitive compounds are considered to be either positive working or negative working, depending on whether the affect of the radiation is to increase or decrease the solubility of the compounds. Negative-working compounds commonly are based on photo cross-linkable compounds (e.g. cinnamate type materials) or the so called diazo resins. The former provide printing plates having a good printing run length which is capable of being substantially increased by baking the exposed compound. They also have a reasonable sensitivity. However, they have the disadvantage, which is becoming increasingly important, that an organic solvent has to be used as the developer liquid. Diazo resins are of comparable sensitivity but have the disadvantage that the printing run length is substantially lower, and moreover, they cannot be baked to increase the run length of printing plates made therefrom. Their main advantage is that they can be developed in an aqueous-based developer liquid.

OBJECTS AND SUMMARY OF THE INVENTION

It is an object of the present invention to provide a radiation-sensitive compound which, without loss in sensitivity, has the aqueous developability characteristics of the diazo resins, and the run length characteristics, including the capability of being baked, of the photo cross-linkable compounds.

According to one aspect of the invention, there is provided a radiation-sensitive compound comprising a polymer including a plurality of azide-substituted aromatic ester groups and a plurality of groups capable of imparting to the compound solubility in an aqueous or alkaline medium.

Suitable groups imparting solubility in aqueous or alkaline media are carboxylic or sulphonic acid groups and their salts.

According to another aspect of the present invention there is provided a process for the production of a radiation-sensitive compound which comprises providing a polymer including a plurality of hydroxyl groups and optionally epoxide groups; reacting an azide-substituted aromatic carboxylic acid, or ester-forming derivative thereof, with some of the hydroxyl groups and/or at least some of the epoxide groups if present; and reacting a cyclic carboxylic acid anhydride or cyclic sulpho-carboxylic anhydride with at least some of the remaining hydroxyl groups to introduce, into the compound, alkali- or aqueous-solubilising groups.

The anhydride may react with the hydroxyl group containing polymer backbone either via the anhydride group or via a further functional group present in the anhydride.

DETAILED DESCRIPTION OF THE INVENTION

Generally the radiation-sensitive compound may be prepared by first forming as an intermediate, a resin containing light sensitive azide groups. This intermediate resin is isolated and washed essentially free of unesterified azide compounds. The resultant polymer is then further reacted with a suitable anhydride-containing material to generate carboxylic acid groups and/or sulphonic acid groups, pendant to the polymer chain. A second isolation and washing procedure removes any remaining unwanted monomeric materials.

Suitable examples of three classes of anhydride-containing materials which may be used are:

1. Cyclic Carboxylic Acid Anhydrides

Maleic anhydride and derivatives thereof, for example, dimethyl maleic anhydride or citraconic anhydride; succinic anhydride and derivatives thereof, for example, methyl succinic anhydride; glutaric anhydride and derivatives thereof, for example, 3-methyl glutaric anhydride, 3,3-tetramethylene glutaric anhydride, or camphoric acid anhydride; 3-oxa-glutaric anhydride and derivatives thereof; phthalic anhydride and substitution products thereof, for example, chloro, nitro or carboxyphthalic anhydride, partially or completely hydrogenated phthalic anhydrides, for example, hexahydrophthalic anhydride or cyclohexene-1,2-dicarboxylic acid anhydride; naphthalene-2,3-dicarboxylic acid anhydride or naphthalene-1,8-dicarboxylic acid anhydride and substitution products thereof; pyridine-o-dicarboxylic acid anhydride and substitution products thereof; pyrazine-dicarboxylic acid anhydride and substitution products thereof; furan-o-dicarboxylic acid anhydride or furan-2,5-dicarboxylic acid anhydride, the substitution products thereof and the partially or completely hydrogenated derivatives thereof; thiophene-o-dicarboxylic acid anhydride or thiophene-2,5-dicarboxylic acid anhydride, the substitution products thereof and the completely or partially hydrogenated derivatives thereof; and dicyclic or polycyclic anhydrides formed by the Diels-Alder reaction of a diene with maleic anhydride, for example, the addition products from furan, anthracene, cyclohexadiene-1,3 or cyclopentadien with maleic anhydride.

The products obtained from the reaction with maleic anhydride, phthalic anhydride, succinic anhydride or 3-oxa-glutaric anhydride are preferred.

2. Cyclic Sulpho-carboxylic Acid Anhydrides 2-sulphobenzoic acid cyclic anhydride; 3,4,5,6-tetra bromo-2-sulphobenzoic acid cyclic anhydride; sulphoacetic acid anhydride; 4-sulpho-1,8-naphthalic anhydride; the anhydrides of 3-sulpho-2-naphthoic acid, 3-sulphophthalic acid, and 4-sulphophthalic acid; and 3-sulphopropionic acid cyclic anhydride.

3. Further Functional Group-containing Cyclic Anhydrides 3-isocyanato phthalic acid anhydride; 4-isocyanato phthalic acid anhydride; trimellitic acid anhydride chloride; 4-chlorosulphonyl-1,8-naphthalic acid anhydride; and the Diels-Alder reaction product of sorbic acid and maleic acid anhydride.

Compounds of class 1 will produce pendant carboxylic acid groups linked to the backbone polymer through ester groups.

Compounds of class 2 will produce pendant sulphonic acid groups linked to the backbone polymer Compounds of class 3 will produce pendant anhydride groups linked to the backbone polymer through ester or urethane groups. The anhydride groups would then be converted to dicarboxylic acids, or to half esters during the reaction sequence.

According to one aspect of the present invention, the alkali- or aqueous- solubilising groups are of the formula

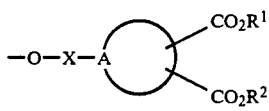

attached to carbon atoms which are part of the backbone of the polymer where, X is

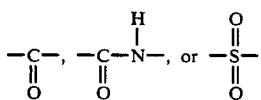

A is a moiety made up of sufficient carbon and/or hetero atoms to form a ring or fused ring system, and $R^1$ and $R^2$ are H or lower alkyl, provided that at least one of $R^1$ and $R^2$ is H.

In this case the solubilising groups can be introduced by reacting hydroxyl groups (and/or epoxide groups if present) of the polymer with a reagent containing both a cyclic anhydride group and a further functional group, which further functional group is capable of reacting with said hydroxyl groups (and/or epoxide groups if present) preferentially relative to the anhydride group and changing the anhydride groups in a conversion step to carboxylic acid groups or to a carboxylic acid group and an ester group.

The further functional group may be an isocyanate, a carboxylic acid or suitable derivative thereof, or a sulphonic acid or suitable derivative thereof.

The conversion step eliminates premature crosslinking and may be carried out by adding water or a primary alcohol to the reaction mixture. The use of the alcohol does, of course, produce an ester group which confers additional oleophilicity to the polymer in the unbaked state.

Particularly preferred polymers are:

1. Poly (vinyl acetate) or copolymers of vinyl acetate with other vinyl monomers and which have been at least partially saponified, and esters or acetal derivatives of such saponified materials. Examples of such polymers are poly (vinyl alcohols) having between 80% and 100% (by weight) vinyl alcohol units and molecular weights of approximately 50,000 and poly (vinyl butyrals) and other poly (vinyl acetals) having at least 10% by weight of vinyl alcohol units and molecular weights in the range 20,000 to 80,000.

2. Epoxy resins which are condensation products of epichlorohydrin with aromatic hydroxy compounds such as bisphenol A and which have molecular weights in the range of 900 to 5,000.

3. Poly (meth) acrylate esters and in particular those derived from 2-hydroxy propyl methacrylate or 2-hydroxy ethyl methacrylate.

4. Copolymers containing free hydroxyl groups such as styrene-allyl alcohol copolymers;

5. Novolak resins which are the condensation products of phenols or cresols with formaldehyde.

6. Polymers derived from vinyl phenols.

In a preferred embodiment, the azide-substituted aromatic ester groups are of the general formula:

attached to carbon atoms of the polymer wherein a and b are zero or 1 and a+b is at least 1; R represents an aromatic radical optionally substituted with a group or groups additional to the azido group; and $R^3$, $R^4$, $R^5$ and $R^6$, which may be the same or different, represent halogen atoms, hydrogen atoms, cyano groups, alkyl groups, aryl groups, alkoxy groups, aryloxy groups, aralkyl groups or aralkoxy groups provided that at least one of the groups $R^3$ to $R^6$ represents a halogen atom or a cyano group.

Such azide-substituted aromatic ester groups may be introduced by reacting the polymer with the corresponding azide substituted aromatic carboxylic acid of the formula $N_3-R-(CR^3=CR^4)_a-(CR^5=CR^6)_b-COOH$ or with the acid chloride or anhydride thereof.

Particularly preferred are ester groups derived from the following acids:
4-azido-α-bromo-α-chlorocinnamylidene acetic acid
4-azido-α-chlorocinnamylidene acetic acid
4-azido-α-cyano-α-chlorocinnamylidene acetic acid
4-azido-α-cyano-cinnamylidene acetic acid
3-azido-benzylidene-α-cynaoacetic acid
4-azido-2-chlorobenzylidene-α-cyanoacetic acid
4-azido-3,5-dibromobenzylidene-α-cyanoacetic acid
3-azido-4-methyl-benzylidene-α-cyanoacetic acid
3-azido-4-methoxybenzylidene-α-cyanoacetic acid
4-azido-benzylidene-α-bromo-cyanoacetic acid
4-azidobenzylidene-α-cyanoacetic acid, and
4-azido-3-chlorobenzylidene-α-cyanoacetic acid.

Also of value are azide substituted N-phenyl anthranilic acids such as

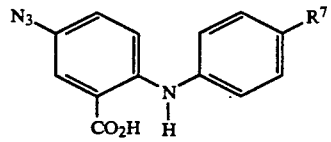

where $R^7$=hydrogen, methyl, methoxy or chlorine.

Optionally, the polymer may also have attached thereto ester groups derived from non-azido-group containing aliphatic or aromatic carboxylic acids such as propionic acid, benzoic acid or octanoic acid.

If the acids themselves are used to esterify the hydroxy and/or epoxide groups, reagents such as di(cyclohexyl) carbodiimide may be used to promote esterification. If the acid chloride or acid anhydride is used, then suitable acid binders or catalysts may be required, such as pyridine, sodium carbonate or sodium acetate.

Whilst the compounds of the invention may be used as the sole radiation-sensitive compound in compositions for use in the manufacture of printing plates or for use as photoresists, they may be also used in conjunction with other radiation-sensitive compounds.

Accordingly a further aspect of the present invention comprises a radiation-sensitive composition comprising a radiation-sensitive compound as defined above, and at least one other radiation-sensitive compound.

Preferably, said other radiation-sensitive compound is a diazo compound such as is defined in European patent specification No. 30862 or as is produced by the condensation of diazo diphenyl amine and formaldehyde.

The following Examples illustrate the invention.

BAKEABLE AQUEOUS PHOTOPOLYMER

EXAMPLE 1

40 g of poly(vinyl butyral) containing 74% by weight of vinyl butyral units, 2% by weight acetate units and 24% by weight of vinyl alcohol units and having an approximate average molecular weight of 30,000 was dissolved in 350 cm$^3$ of anhydrous tetra hydrofuran (THF). To this solution was added 10.1 g of pyridine followed by a solution containing 27 g of 4-azido benzylidene-alpha-cyano acetic acid chloride dissolved in 100 cm$^3$ of THF. (The latter was added was allowed to continue at ambient temperature for a further 18 hours after which time the product was isolated by spraying the reaction mix into five liters of water. The resulting fibrous precipitate was filtered off, washed twice with three liters of 1% w/w potassium carbonate solution to remove any free acid and then reslurried into water three times. The final product was then dried at 35° C. to constant weight.

% Nitrogen determination showed that this product contained 13.3 mol % of the azide containing ester group.

30 g of the above azide modified poly(vinyl butyral) were redissolved in 300 cm$^3$ of anhydrous THF and to this solution were added 5.92 g of pyridine. This solution was then cooled to −10° C. and 15.8 g of trimellitic anhydride chloride were added over one hour, whilst maintaining the reaction temperature at −10° C. The reaction was then allowed to continue for a further 18 hours at −10° C. after which time 40 cm$^3$ of methanol were added dripwise. The reaction was allowed to warm to ambient temperature and was then stirred at ambient temperature for two hours after which the temperature was raised to 40° C. and held there for 12 hours. After this time the product was isolated by spraying into five liters of water. The resulting fibrous precipitate was filtered off and reslurried in three liters of water three times. The final product was then dried at 30° C. to constant weight.

Titration with 0.1 molar KOH solution showed that the final product had an acid value of 65.

EXAMPLE 2

20 g of an epoxy resin obtained by condensing epichlorohydrin and bisphenol A and having a molecular weight of 1400 were dissolved in 100 cm$^3$ of dichloromethane. To this solution were added 11.4 g of 4-azido benzylidene-alpha-cyano acetic acid chloride and 4.3 g of pyridine and the reaction was then heated to reflux and held at reflux for three hours. After this time the reaction was cooled to ambient temperature and screened to remove pyridine hydrochloride and the filtrates were sprayed into two liters of propan-2-ol. The resulting fibrous precipitate was filtered off, reslurried in a further two liters of propan-2-ol, filtered and dried at ambient temperature to constant weight.

% Nitrogen determination showed that the product contained 58 mol % of the azide containing ester group.

20 g of the above modified resin were redissolved in 180 cm$^3$ of anhydrous THF and to this solution were added 2.23 g of pyridine. This solution was then cooled to −10° C. and 5.3 g of trimellitic anhydride chloride were added at −10° C. over one hour. The reaction was maintained at −10° C. for a further 18 hours and then a solution prepared from 10 cm$^3$ of water and 30 cm$^3$ of THF was dripped into the reaction mix over one hour whilst maintaining the temperature at −10° C. The reaction temperature was then allowed to warm to ambient temperature, held at this temperature for two hours and then warmed to 40° C., and held at 40° C. for 12 hours. After this time the product was isolated by spraying into five liters of water. The resulting fibrous precipitate was filtered off and reslurried in three liters of water three times. The final product was dried at 30° C. to constant weight.

Titration with 0.1 molar KOH solution showed that the final product had an acid value of 99.5.

EXAMPLE 3

Poly(vinyl butyral) was reacted with 4-azido benzylidene-alpha-cyano acetic acid chloride as in Example 1. 30 g of this isolated and dried product were then dissolved in 300 cm$^3$ of anhydrous THF and to this solution were added 0.04 g of anhydrous sodium carbonate followed by 6.9 g of sulpho benzoic acid cyclic anhydride. The reaction was allowed to continue at ambient temperature for a further two hours after which time the product was isolated by spraying the reaction mix into five liters of water. The resulting fibrous precipitate was filtered off and reslurried into three liters of water three times. The final product was then dried at 35° C. to constant weight.

Titration with 0.1 molar KOH solution showed that the final product had an acid value of 22.

EXAMPLE 4

The product from Example 3 was further modified by reslurrying 20 g of the dried resin in 200 cm$^3$ of industrial methylated spirit (IMS) (generally a mixture of 95% vol. alcohol and 5% vol. of wood naphtha) followed by the addition of 2.86 g cetyl trimethyl ammonium bromide. On addition of the quaternary ammonium salt a solution was formed and the resin was then be isolated from this solution by spraying the reaction mix into five liters of water and washing with water as in Example 3.

After drying at 35° C., % N and % S determination show that the quaternary ammonium salt had ion-exchanged with all the acidic protons.

EXAMPLE 5

An epoxy resin was modified with 4-azidobenzylidene-alpha-cyano acetic acid chloride as in Example 2. 20 g of this isolated and dried resin were redissolved in 150 cm$^3$ of anhydrous THF and to this solution were added 4.5 g of phthalic anhydride, 0.03 g of anhydrous sodium carbonate and 0.05 g of 4-dimethylamino pyridine. The reaction mix was then heated to 45° C. and held at this temperature for a further 72 hours after which time the product was isolated as in Example 2.

Titration with 0.1 molar KOH solution showed that the final product had an acid value of 52.

EXAMPLE 6

A resin was prepared as in Example 1 except that 31 g of 3-chloro-4-azido benzylidene-alpha-cyano acetic acid chloride were used instead of 27 g of 4-azido benzylidine-alpha-cyano acetic acid chloride.

EXAMPLE 7

A resin was prepared as in Example 1 except that the starting poly(vinyl butyral) was pre-reacted with lauroyl chloride such that the intermediate resin contained 10 mol % lauroyl ester. This isolated and dried resin was then reacted with 4-azido benzylidene-alpha-cyano acetic acid chloride and trimellitic anhydride chloride as in Example 1.

EXAMPLE 8 (COMPARATIVE EXAMPLE)

A resin was prepared as for Example 4 except that the first stage of the reaction was omitted. That is poly(vinyl butyral) was reacted with 2-sulpho benzoic acid cyclic anhydride in the presence of sodium carbonate followed by an ion exchange with cetyl trimethyl ammonium bromide.

EXAMPLE 9 (COMPARATIVE EXAMPLE)

A resin was prepared as for Example 2 except that the second stage of the reaction was omitted. That is, an epoxy resin was reacted with 4-azido benzylidene-alpha-cyano acetic acid chloride in the presence of pyridine. This product was then isolated as previously described.

EXAMPLE 10

20 g of an epoxy resin obtained by condensing epichlorohydrin and Bisphenol A and having a molecular weight of 1400 were dissolved in 100 cm$^3$ of dichloromethane. To this solution were added 13.0 g of 4-azido-2-chlorobenzylidene-alpha-cyanoacetic acid chloride and 4.3 g of pyridine and the reaction was then heated under reflux and held at reflux for 4 hours. After this time, the reaction was cooled to ambient temperature and screened to remove pyridine hydrochloride and the filtrates were sprayed into two liters of propan-2-ol. The resulting fibrous precipitate was filtered off, re-slurried in a further 2 liters of propan-2-ol, filtered and dried at ambient temperature to constant weight.

% Nitrogen determination showed that the product contained 47 mol % of the azide containing ester group.

20 g of the above modified resin were redissolved in 180 cm$^3$ of anhydrous THF and to this solution were added 2.3 g of pyridine. This solution was then cooled to −10° C. and 5.2 g of trimellitic anhydride chloride were added at −10° C. over one hour. The reaction was maintained at −10° C. for a further 18 hours and then a solution prepared from 10 cm$^3$ of water and 30 cm$^3$ of THF was dripped into the reaction mix over one hour whilst maintaining the temperature at −10° C. The reaction temperature was then allowed to warm to ambient temperature, held at this temperature for two hours and then warmed to 40° C., and held at 40° C. for 12 hours. After this time, the product was isolated by spraying into five liters of water. The resulting fibrous precipitate was filtered off and reslurried in three liters of water three times. The final product was dried at 30° C. to constant weight.

Titration with 0.1 molar KOH solution showed that the final product had an acid value of 108.5.

EXAMPLE 11

Poly(vinyl butryal) was reacted with 4-azido benzylidene-alpha-cyano acetic acid chloride as in Example 1. 30 g of the isolated and dried product were then dissolved in 300 cm$^3$ of anhydrous THF and to this solution were added 0.04 g of anhydrous sodium carbonate followed by 3.7 g of maleic anhydride. The reaction was then heated to 40° C. and maintained at this temperature for a further 72 hours after which time the product was isolated by spraying the reaction mixture into five liters of water. The resulting fibrous precipitate was filtered off and re-slurried into three liters of water three times. The final product was then dried at 35° C. to constant weight.

Titration with 0.1 molar KOH solution showed that the final product had an acid value of 30.

EXAMPLE 12

Poly(vinyl butyral) was reacted with 33.0 g 4-azidobenzylidene-alpha-bromoacetic acid chloride as in Example 1. 30 g of the isolated and dried product were then dissolved in 300 cm$^3$ of anhydrous THF and to this solution were added 0.04 g of anhydrous sodium carbonate followed by 3.7 g of maleic anhydride. The reaction was then heated to 40° C. and maintained at this temperature for a further 72 hours after which time the product was isolated by spraying the reaction mixture into five liters of water. The resulting fibrous precipitate was filtered off and re-slurried into three liters of water three times. The final product was then dried at 35° C. to constant weight.

Titration with 0.1 molar KOH solution showed that the final product had an acid value of 32.

EXAMPLE 13

Poly(vinyl butyral) was reacted with 4-azido benzylidene-alpha-cyanoacetic acid chloride as in Example 1. 30 g of the isolated and dried product were then dissolved in 300 cm$^3$ of anhydrous THF and to this solution were added 0.04 g of anhydrous sodium carbonate followed by 18.8 g of 3,4,5,6-tetrabromo-2-sulphobenzoic acid cyclic anhydride. The reaction was allowed to continue at ambient temperature for a further 8 hours after which time the product was isolated by spraying the reaction mixture into five liters of water. The resulting fibrous precipitate was filtered off and re-slurried into three liters of water three times. The final product was then dried at 30° C. to constant weight.

Titration with 0.1 molar KOH solution showed that the final product had an acid value of 24.

EXAMPLE 14

20 g of an epoxy resin obtained by condensing epichlorohydrin and Bisphenol A and having a molecular weight of 1400 were dissolved in 100 cm$^3$ of dichloromethane. To this solution were added 16.0 g of 4-azidobenzylidine-alpha-bromoacetic acid chloride and 4.3 g of pyridine and the reaction was then heated to reflux and held at reflux for three hours. After this time, the reaction was cooled to ambient temperature and screened to remove pyridine hydrochloride and the filtrates were sprayed into two liters of propan-2-ol. The resulting fibrous precipitate was filtered off, reslurried in a further 2 liters of propan-2-ol, filtered and dried at ambient temperature to constant weight.

% Nitrogen determination showed that the product contained 40 mol % of the azide containing ester groups.

20 g of the above modified resin were redissolved dissolved in 180 cm$^3$ of anhydrous THF and to this solution were added 2.23 g of pyridine. This solution was then cooled to $-10°$ C. and 5.2 g of trimellitic anhydride chloride were added at $-10°$ C. over one hour. The reaction was maintained at $-10°$ C. for a further 18 hours and then a solution prepared from 10 cm$^3$ of water and 30 cm$^3$ of THF was dripped into the reaction mixture over one hour whilst maintaining the temperature at $-10°$ C. The reaction temperature was then allowed to warm to ambient temperature, held at this temperature for two hours and then warmed to 40° C., and held at 40° C. for 12 hours. After this time, the product was isolated by spraying into five liters of water. The resulting fibrous precipitate was filtered off and re-slurried in three liters of water three times. The final product was dried at 30° C. to constant weight.

Titration with 0.1 molar KOH solution showed that the final product had an acid value of 118.

Printing plates were prepared from a number of the aforementioned radiation-sensitive compounds. Details of the methods of preparation for the printing plates are given below:

PREPARATION OF PRINTING PLATE

Type I 2.6 g of the radiation sensitive compound and 0.06 g of Victoria Pure Blue BO dye were dissolved in 100 cm$^3$ of ethylene glycol monomethyl ether. After filtering to remove any solids, the solution was whirler-coated onto a sheet of electrograined and anodised aluminium to give a coating weight of 0.7–0.9 gm$^{-2}$.

The plate was exposed and developed and the sensitivity and development characteristics are shown in Table 1.

Type II 1.7 g of the radiation sensitive compound, 0.9 g of a diazo compound as described in Example 1 of European Patent Specification No. 30862 and 0.06 g of Victoria Pure Blue BO dye were dissolved in 100 cm$^3$ of ethylene glycol monomethyl ether, and the solution was used to prepare a printing plate as described in Example I. The sensitivity and developability characteristics are set out in Table 1.

Type III 0.7 g of the radiation sensitive compound, 1.9 g of a diazo compound as described in Example 1 of European Patent Specification No. 30862 and 0.06 g of Victoria Pure Blue BO dye were dissolved in 100 cm$^3$ of ethylene glycol monomethyl ether, and the solution was used to prepare a printing plate as described in Example I. The sensitivity and developability characteristics are set out in Table 1. Table 1 gives the following data:

Column 1—"Example no."
This indicates which radiation sensitive compound was tested.

Column 2—"Type of printing plate."
This indicates in which type of printing plate formulation the aforementioned radiation sensitive compound was tested.

Column 3—"Developer type."
This indicates in which type of developer the aforementioned printing plate was developed. The following types were used:

Type W=An aqueous solution as described in Example 1 of GB Patent Specification No. 2068136

Type X=An aqueous solution of a surfactant containing 7% benzyl alcohol

Type Y=A mixture of glycol ester and a surfactant as described in Example 8 of GB Patent Specification No. 1220808

Column 4—"Sensitivity"
The sensitivity was determined using an IL540 photometer marketed by International Light Inc. and is the amount of radiation needed to produce, after inking, a solid step 4 when the plate was exposed through a continuous tone stepwedge.

Column 5—"No. of impressions"
This indicates how many impressions were obtained when the aforementioned printing plates were tested on a rotary web offset press.

"Baked"

This indicates that the plate was heated to 200° C. for 10 minutes in accordance with the treatment described in GB Patent Specification No. 1513368.

TABLE 1

| 1 Example No. | 2 Type of Printing Plate | 3 Developer Type | 4 Sensitivity mJcm$^{-2}$ | 5 No. of impressions | |
|---|---|---|---|---|---|
| | | | | Unbaked | Baked |
| 1 | I | X | 330 | 65 × 10$^3$ | 80 × 10$^3$ |
| 1 | II | X | 280 | 60 × 10$^3$ | 70 × 10$^3$ |
| 1 | III | W | 400 | 60 × 10$^3$ | 70 × 10$^3$ |
| 2 | I | X | 560 | 80 × 10$^3$ | 100 × 10$^3$ |
| 4 | II | W | 300 | 65 × 10$^3$ | 80 × 10$^3$ |
| 4 | III | W | 350 | 65 × 10$^3$ | 80 × 10$^3$ |
| 5 | II | X | 250 | 70 × 10$^3$ | 80 × 10$^3$ |
| 6 | II | W | 610 | 65 × 10$^3$ | 80 × 10$^3$ |
| 8 | II | W | 700 | 60 × 10$^3$ | 60 × 10$^3$ |
| 9 | I | Y | 700 | 70 × 10$^3$ | 85 × 10$^3$ |

We claim:

1. A radiation sensitive plate comprising a substrate coated with a radiation-sensitive composition which comprises a radiation-sensitive compound, the radiation-sensitive compound comprising a polymer including a plurality of groups capable of imparting to the compound solubility in aqueous or alkaline medium, wherein the solubility-imparting groups are groups of the formula

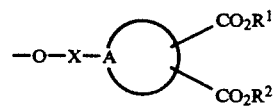

in which X is

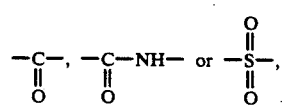

A is a moiety made up of sufficient carbon atoms to form a ring or fused ring system, and including R$^1$ and R$^2$ are H or lower alkyl provided that at least one of R$^1$ and R$^2$ is hydrogen, said solubility-imparting groups being linked to the polymer by ester groups, and a plurality of azide-substituted N-phenyl anthranilic ester group or azide groups having the general formula $$N_3-R-(CR^3=CR^4)_a-(CR^5=CR^6)_b-COO-$$

wherein a and b are each 0 or 1 and the sum of a and b is at least 1; R represents an aromatic radical; and $R^3$, $R^4$, $R^5$, $R^6$, which may be the same or different, represent halogen atoms, hydrogen atoms, cyano groups, alkyl groups, aryl groups, alkoxy groups, aryloxy groups, aralkyl groups, or aralkoxy groups provided that at least one of the groups $R^3$ to $R^6$ represents a halogen atom or cyano group, said solubility imparting groups beings present in an amount sufficient to impart, to the compound, solubility in aqueous or alkaline medium and said azide groups being present in an amount sufficient to impart photosensitivity to the compound.

2. A radiation sensitive compound comprising a polymer including a plurality of azide substituted aromatic ester groups and a plurality of groups capable of imparting to the compound solubility in aqueous or alkaline medium wherein the solubility imparting groups are groups of the formula

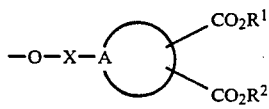

attached to carbon atoms forming part of the backbone of the polymer where X is

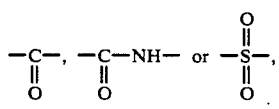

A is a moiety made up of sufficient carbon atoms to form a ring or fused ring system, and $R^1$ and $R^2$ are H or lower alkyl provided that at least one of $R^1$ and $R^2$ is hydrogen.

3. A radiation sensitive compound comprising a polymer including a plurality of groups capable of imparting to the compound solubility in aqueous or alkaline medium, wherein the solubility-imparting groups are groups of the formula

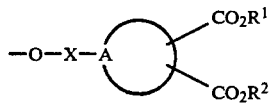

in which X is

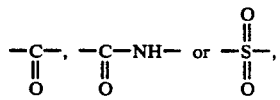

A is a moiety made up of sufficient carbon atoms to form a ring or fused ring system, and $R^1$ and $R^2$ are H or lower alkyl provided that at least one of $R^1$ and $R^2$ is hydrogen, said solubility-imparting groups beings linked to the polymer by ester groups, and a plurality of azide-substituted N-phenyl anthranilic ester groups or azide groups having the general formula $$N_3-R-(CR^3=CR^4)_a-(CR^5=CR^6)_b-COO$$

wherein a and b are each 0 and 1 and the sum of a and b is at least 1; R represents an aromatic radical; and $R^3$, $R^4$, $R^5$, and $R^6$, which may be the same or different, represent halogen atoms, hydrogen atoms, cyano groups, alkyl groups, aryl groups, alkoxy groups, aryloxy groups, aralkyl groups, or aralkoxy groups provided that at least one of the groups $R^3$ to $R^6$ represents a halogen atom or cyano group, said solubility imparting groups being present in an amount sufficient to impart, to the compound, solubility in aqueous or alkaline medium and said azide groups being present in an amount sufficient to impart photosensitivity to the compound.

4. A radiation-sensitive polymer that is soluble in water or aqueous alkaline solutions comprising a base polymer selected from the group consisting of polyvinyl alcohols and epoxy resins; said base polymer including a plurality of azide-substituted aromatic ester groups and a plurality of solubilizing groups linked to the base polymer by an anhydride selected from the group consisting of trimellitic anhydride chloride, phthalic anhydride, maleic anhydride and sulpher benzoic acid cyclic anhydride.

5. The radiation sensitive polymer of claim 4 wherein the azide substituted aromatic ester group is derived from a compound selected from the group consisting of 4-azido benzylidene-alpha-cyano acetic acid chloride, 3-chloro-4-azido benylidene-alpha-cyanoacetic acid chloride and 4-azido benzylidene-alpha-bromoacetic acid chloride.

6. A compound as set forth in claim 3 wherein said azide-substituted anthranilic ester has the formula

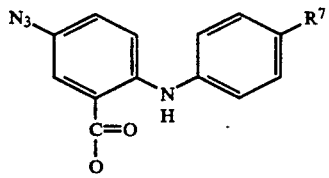

where $R^7$ is hydrogen, methyl, methoxy or chlorine.

* * * * *